US012628379B2

(12) United States Patent
Wang et al.

(10) Patent No.: US 12,628,379 B2
(45) Date of Patent: May 12, 2026

(54) THIN FILM TRANSISTOR AND DISPLAY PANEL

(71) Applicant: BOE TECHNOLOGY GROUP CO., LTD., Beijing (CN)

(72) Inventors: Dongfang Wang, Beijing (CN); Lizhong Wang, Beijing (CN); Ce Ning, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 567 days.

(21) Appl. No.: 18/023,766

(22) PCT Filed: Mar. 31, 2022

(86) PCT No.: PCT/CN2022/084410
§ 371 (c)(1),
(2) Date: Feb. 28, 2023

(87) PCT Pub. No.: WO2023/184337
PCT Pub. Date: Oct. 5, 2023

(65) Prior Publication Data
US 2024/0290890 A1      Aug. 29, 2024

(51) Int. Cl.
*H10D 30/67*          (2025.01)
(52) U.S. Cl.
CPC ..... *H10D 30/6755* (2025.01); *H10D 30/6729* (2025.01)

(58) Field of Classification Search
CPC ...................... H10D 30/6755; H10D 30/6729
See application file for complete search history.

(56) References Cited

U.S. PATENT DOCUMENTS

| | | | |
|---|---|---|---|
| 6,846,709 B1 | 1/2005 | Lojek | |
| 2017/0256649 A1* | 9/2017 | Takamaru | H10D 30/673 |
| 2017/0317110 A1* | 11/2017 | Lee | G02F 1/136209 |
| 2018/0259820 A1* | 9/2018 | Okada | G02F 1/136227 |
| 2019/0157306 A1* | 5/2019 | Chang | H10D 86/0231 |

FOREIGN PATENT DOCUMENTS

| | | |
|---|---|---|
| CN | 109873025 A | 6/2019 |
| CN | 112103244 A | 12/2020 |
| CN | 114005838 A | 2/2022 |

* cited by examiner

*Primary Examiner* — Jeff W Natalini
*Assistant Examiner* — Rose Keagy
(74) *Attorney, Agent, or Firm* — HOUTTEMAN LAW LLC

(57)          ABSTRACT

A thin film transistor including a base substrate, and a drain, a source and an active layer on the base substrate, where the drain and the source are in different layers, respectively, and any two of an orthographic projection of the drain on the base substrate, an orthographic projection of the source on the base substrate and an orthographic projection of the active layer on the base substrate at least partially overlap each other.

7 Claims, 8 Drawing Sheets

THIN FILM TRANSISTOR AND DISPLAY PANEL

TECHNICAL FIELD

The present disclosure belongs to the field of display technology, and particularly relates to a thin film transistor and a display panel.

BACKGROUND

At present, with the development of virtual reality technology and augmented reality technology, the demand for a display panel with ultra-high pixel density (PPI) is increasing. That is, more and more pixel structures are arranged in a unit area, and accordingly, more and more thin film transistors of the pixel structures are required to be arranged in the unit area. An area occupied by the thin film transistor in a plane is large at present, which is difficult to meet the requirements on pixels of the display panel with ultra-high PPI.

SUMMARY

The present disclosure aims to solve at least one technical problem in the prior art and provides a thin film transistor and a display panel, which can reduce the area occupied by the thin film transistor in a plane.

In a first aspect, a technical solution to the technical problem according to the present disclosure is a thin film transistor, including a base substrate, and a drain, a source and an active layer on the base substrate, where the drain and the source are in different layers, respectively, and any two of an orthographic projection of the drain on the base substrate, an orthographic projection of the source on the base substrate and an orthographic projection of the active layer on the base substrate at least partially overlap each other.

In some embodiments, the thin film transistor further includes a gate, and the gate, the drain, the source and the active layer are arranged in different layers, respectively; an orthographic projection of the gate on the base substrate at least partially overlaps any one of the orthographic projection of the drain on the base substrate, the orthographic projection of the source on the base substrate and the orthographic projection of the active layer on the base substrate.

In some embodiments, the drain is on a side of the source close to the base substrate, and the gate is on a side of the source away from the base substrate.

In some embodiments, the thin film transistor further includes an interlayer insulating layer between the source and the drain, where the thin film transistor is provided with a first via penetrating through the source and the interlayer insulating layer, and an orthographic projection of the first via on the base substrate is within the orthographic projection of the drain on the base substrate; and where the active layer includes a planar part and a recessed part connected to the planar part; the planar part is on a side of the source away from the drain, and is connected to the source; the recessed part is connected to a part of the planar part at the first via, and the recessed part is concave towards the drain along an inner wall of the first via and is connected to the drain.

In some embodiments, a via diameter of the inner wall of the first via gradually decreases in a direction from the source to the drain; and an orthographic projection of a bottom of the recessed part connected to the drain on the base substrate is within an orthographic projection, on the base substrate, of an end aperture of the first via far away from the base substrate.

In some embodiments, the gate includes a main body part and a protrusion part connected to the main body part, where the main body part is on a side of the planar part away from the source, and the protrusion part is in a recessed accommodation space defined by the recessed part and the main body part; and the thin film transistor further includes a gate insulating layer, and the gate insulating layer including a first part between the main body part and the planar part and a second part between the protrusion part and the recessed part.

In some embodiments, the orthographic projection of the source on the base substrate covers the orthographic projections of the drain and the active layer on the base substrate.

In some embodiments, the thin film transistor further includes a gate, a connecting electrode, an interlayer insulating layer and a first insulating layer, the first insulating layer is on a side of the gate away from the base substrate, the interlayer insulating layer is between the source and the drain, and the connecting electrode is on a side of the first insulating layer away from the gate; and the thin film transistor is provided with a second via penetrating through the interlayer insulating layer and the first insulating layer, and the connecting electrode is connected to the source through the second via.

In some embodiments, an orthographic projection of the second via on the base substrate has no overlapping region with each of orthographic projections of the gate and the drain on the base substrate.

In some embodiments, the active layer is a metal oxide active layer.

In a second aspect, the present disclosure further provides a display panel including a plurality of thin film transistors, each of which is the thin film transistor in any of the above embodiments.

In some embodiments, the display panel further includes a plurality of gate lines extending along a first direction and arranged at intervals and a plurality of data lines extending along a second direction and arranged at intervals, where the first direction and the second direction intersect with each other; where, a position, where an orthographic projection of each of the plurality of gate lines on the base substrate and an orthographic projection of each of the plurality of data line on the base substrate overlap each other, at least partially overlaps an orthographic projection of a corresponding one of the plurality of thin film transistors on the base substrate.

In some embodiments, the position, where an orthographic projection of each of the plurality of gate lines on the base substrate and an orthographic projection of each of the plurality of data line on the base substrate overlap each other, is referred to as an intersection, and the orthographic projection of the first via in the thin film transistor at the intersection on the base substrate at least partially overlaps the intersection.

In some embodiments, the first vias of the thin film transistors on a same gate line are arranged side by side in the first direction.

In some embodiments, the thin film transistors on a same gate line are divided into a first row of thin film transistors and a second row of thin film transistors arranged along the first direction, and the first row of thin film transistors and the second row of thin film transistors are spaced apart from each other along the second direction; between any two thin film transistors belonging to the first row of thin film transistors, is arranged one thin film transistor belonging to the second row of thin film transistors.

In some embodiments, the display panel includes a plurality of pixel structures, each of the plurality of pixel structures includes three sub-pixel structures of different colors, and each of the three sub-pixel structures includes one thin film transistor; and for the three thin film transistors in a same pixel structure,
        the orthographic projection of the second via in one of the three thin film transistors on the base substrate at least partially overlaps the orthographic projection of one corresponding data line on the base substrate, and the orthographic projections of the second vias of different thin film transistors on the base substrate at least partially overlap the orthographic projections of different data lines on the base substrate, respectively.

In some embodiments, for the three thin film transistors in the same pixel structure, connecting lines between every two of centers of the second vias in the three thin film transistors is in a triangle.

In some embodiments, for any two adjacent pixel structures in the plurality of pixel structures, the two adjacent pixel structures are referred to as a first pixel structure and a second pixel structure, respectively, and at least one data line is between the second via in the thin film transistor of the first pixel structure closest to the second pixel structure and the second via in the thin film transistor of the second pixel structure closest to the first pixel structure.

The thin film transistor and the display panel according to the present disclosure adopt a structure where the drain, the source and the active layer are vertically arranged, that is, the drain, the source and the active layer are arranged in different layers and overlap each other in a vertical direction, so that compared with the structure of the thin film transistor in which the source and the drain are arranged in the same layer and at intervals and are connected to the active layer, in the thin film transistor according to the present disclosure, an area occupied by the thin film transistor in a plane can be effectively reduced, therefore, more thin film transistors can be arranged in a unit area, and the requirements on pixels of the display panel with the ultra-high PPI can be met.

BRIEF DESCRIPTION OF DRAWINGS

FIG. 1b is a schematic diagram illustrating a structure of layers of a thin film transistor taken along a line C-D in FIG. 1a.

DETAIL DESCRIPTION OF EMBODIMENTS

Figure 1A:
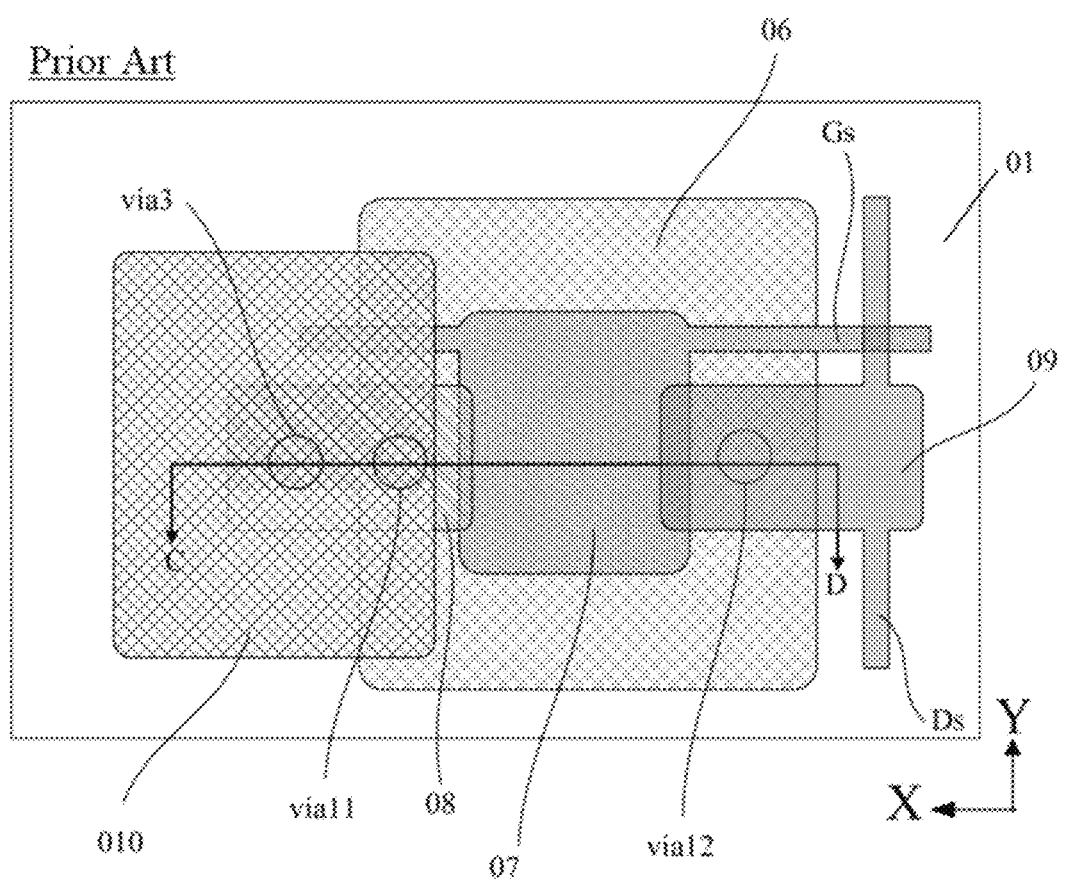
FIG. 1a is a schematic diagram illustrating a structure of a thin film transistor in the related art.

In order to enable one of ordinary skill in the art to better understand the technical solutions of the present disclosure, the present disclosure will be further described in detail below with reference to the accompanying drawings and specific embodiments.

Unless defined otherwise, technical or scientific terms used herein shall have the ordinary meaning as understood by one of ordinary skill in the art to which this disclosure belongs. The use of "first", "second", and the like in the present disclosure is not intended to indicate any order, quantity, or importance, but rather serves to distinguish one element from another. Also, the term "a", "an", "the" or the like does not denote a limitation of quantity, but rather denotes the presence of at least one. The word "comprising", "comprises", or the like means that the element or item preceding the word includes the element or item listed after the word and its equivalent, but does not exclude other elements or items. The term "connected", "coupled" or the like is not restricted to physical or mechanical connections, but may include electrical connections, whether direct or indirect. The terms "upper", "lower", "left", "right", and the like are used only to indicate relative positional relationships, and when the absolute position of the object being described is changed, the relative positional relationships may also be changed accordingly.

In the present disclosure, two structures "in a same layer" means that the two structures are formed of a same material layer, and thus the two structures are in the same layer in the stacking relationship, but it does not represent that the two structures are equidistant from a base substrate, nor that structures of other layers between the two structures and the base substrate are completely the same as each other.

The present disclosure will be described in more detail below with reference to the accompanying drawings. The same elements are denoted by like reference characters throughout the various figures. For purposes of clarity, the various features in the drawings are not drawn to scale. Moreover, certain well-known elements may not be shown in the figures.

It should be noted that, in the present disclosure, any two of a first direction X, a second direction Y, and a third direction Z intersect with each other. In the present disclosure, it is taken as an example for description, that the first direction X and the second direction Y are perpendicular to each other in a plane where a base substrate is located, the first direction X is a longitudinal direction, the second direction Y is a transverse direction, and the third direction Z is a vertical direction perpendicular to the plane where the base substrate is located. However, it does not limit the present disclosure.

It should be noted that in the drawings, in order to facilitate showing the position relationship between the structures of layers, some layers are drawn semitransparent, but this does not mean that the actual structures of the layers are transparent layers. That is, the material of the layer is not limited.

Figure 1B:
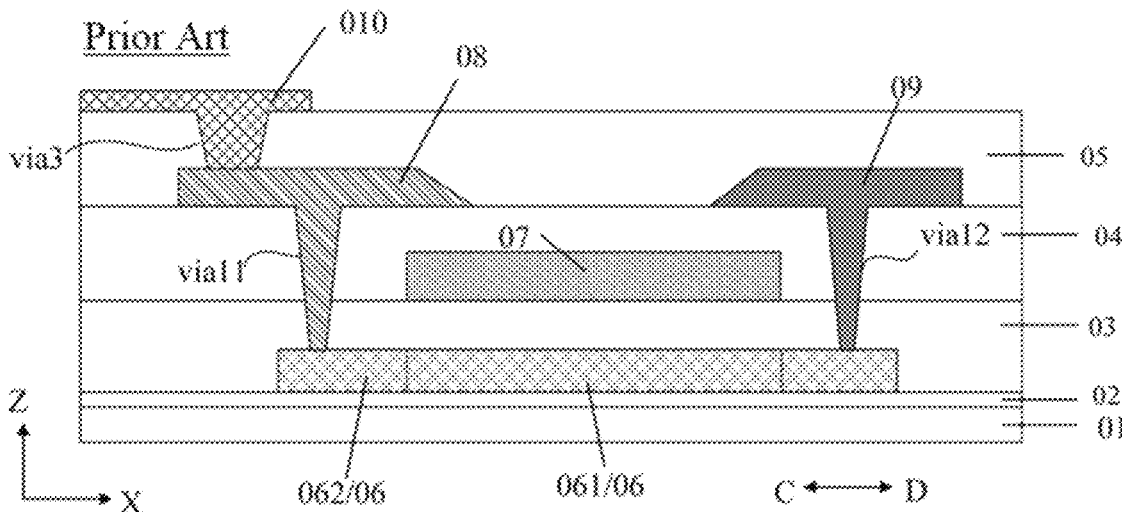

In the related art, a plurality of thin film transistors are provided in a display panel. FIG. 1a illustrates a schematic plan view of a structure of a thin film transistor, and FIG. 1b illustrates a diagram of a structure of layers of the thin film transistor in FIG. 1a. Referring to FIGS. 1a and 1b, the thin film transistor includes: a base substrate 01; a buffer layer 02 arranged on the base substrate 01; and an active layer 06 arranged on a side of the buffer layer 02 away from the base substrate 01. The active layer 06 includes a channel region 061 and a conductorized region 062. A gate 07 is arranged on a side of the active layer 06 away from the base substrate 01, and an orthographic projection of the gate 07 on the base substrate 01 overlaps an orthographic projection of the channel region 061 of the active layer 06 on the base substrate, but does not overlap an orthographic projection of the conductorized region 062 on the base substrate. A gate insulating layer 03 is arranged between the gate 07 and the active layer 06. A source 08 and a drain 09 are arranged on a side of the gate 07 away from the base substrate 01, and the source 08 and the drain 09 are arranged in a same layer, and an interlayer insulating layer 04 is arranged between the source 08/the gate 09 and the gate 07. The source 08 is connected to the conductorized region 62 of the active layer 06 through a first connecting via via11 penetrating through the interlayer insulating layer 04 and the gate insulating layer 03, and the drain 09 is connected to the conductorized region 62 of the active layer 06 through a second connecting via via12 penetrating through the interlayer insulating layer 04 and the gate insulating layer 03. A planarization layer 05 is arranged on a side of the source 08 and the drain 09 away from the base substrate 01. A pixel electrode 010 is arranged on a side of the planarization layer 05 away from the base substrate, and the pixel electrode 010 is connected to the source 08 through a third connecting via via3 penetrating through the planarization layer 05. Generally, a gate line Gs is arranged in the same layer as the gate 07 and connected to the gate 07, a data line Ds is arranged in the same layer as the drain 09 and connected to the drain 09. Here, the source 08 and the drain 09 are arranged in the same layer, and the source 08 and the drain 09 are respectively arranged on two sides of the gate 07, and hardly overlap the gate 07. Therefore, the occupied area of the source 08 and the drain 09 in a plane is large, and thus, in the display panel with the ultra-high PPI, a sufficient number of thin film transistors cannot be arranged in a unit area in the plane. Alternatively, if a sufficient number of thin film transistors are arranged in a unit area, a spacing between the thin film transistors is required to be low, a spacing between the third connecting vias via3 in the adjacent thin film transistors also becomes low, and accordingly, the spacing between the data lines Ds connected to the drains 09 in the adjacent thin film transistors also becomes low, so that interference is prone to occur, and the performance of the thin film transistors is affected. In conclusion, the structure of the thin film transistor adopted in the related art is difficult to meet the requirement on pixels of the display panel with the ultra-high PPI.

Figure 2:
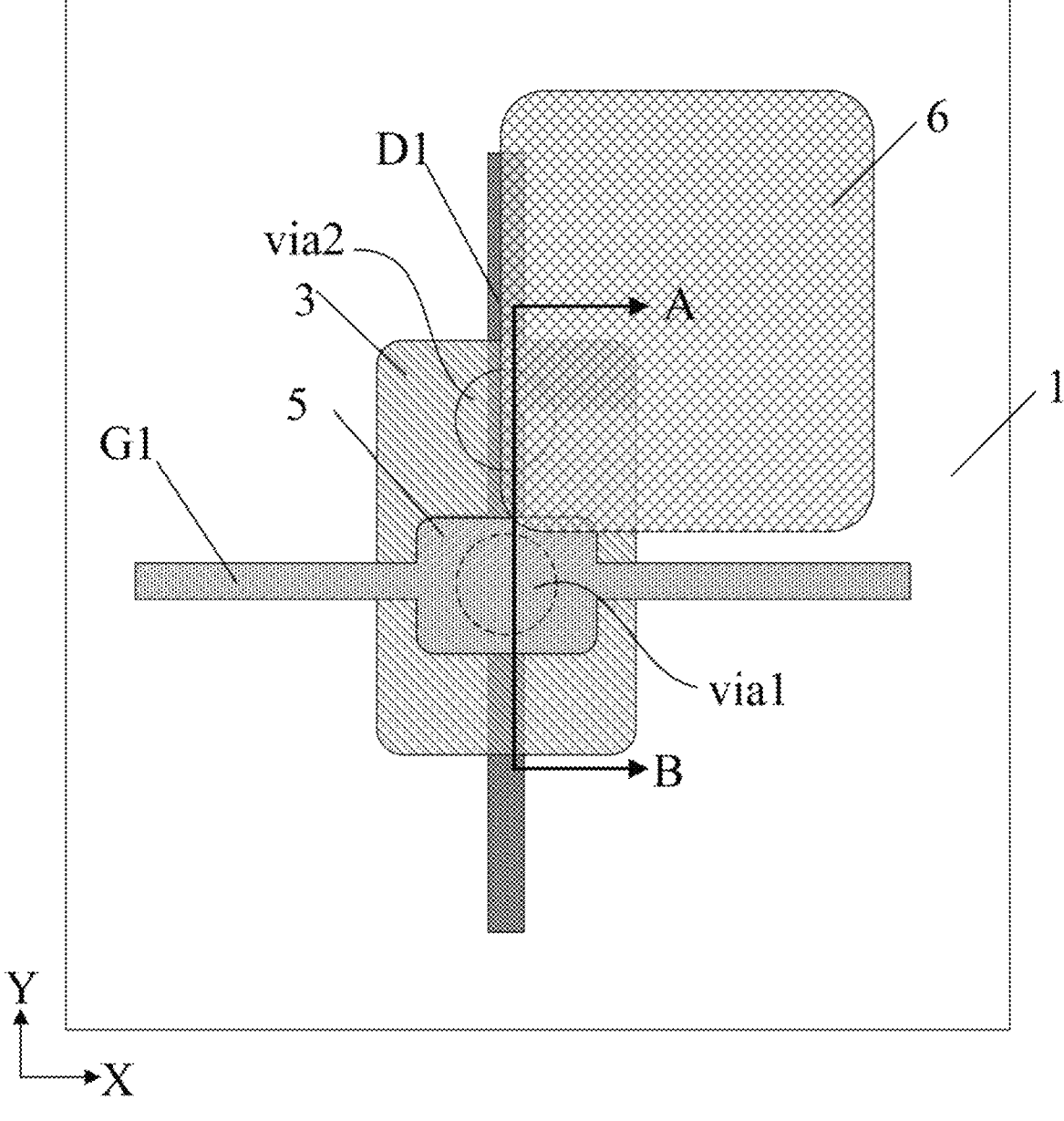
FIG. 2 is a schematic diagram illustrating an exemplary structure of a thin film transistor according to the present disclosure.
Figures 3, 4A:
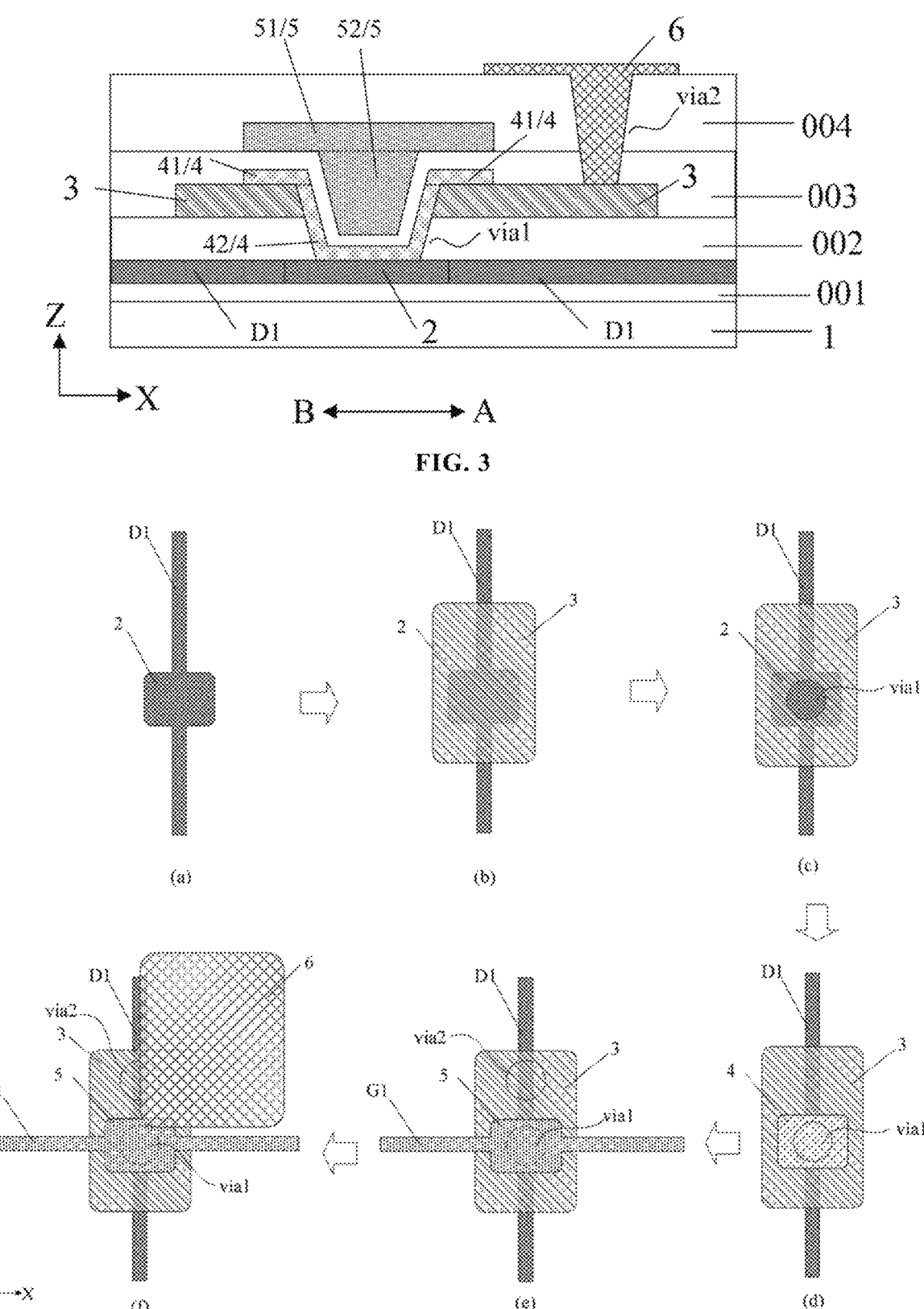
FIG. 3 is a schematic diagram illustrating a structure of layers of a thin film transistor taken along a line A-B in FIG. 2.
FIG. 4a is a schematic diagram illustrating a structure of layers of the thin film transistor shown in FIG. 2.

In order to solve the above problems, in a first aspect, the present disclosure provides a thin film transistor. FIG. 2 illustrates a schematic diagram of an exemplary structure of a thin film transistor in a plan view according to the present disclosure, FIG. 4a is a schematic diagram of a structure of layers of the thin film transistor in FIG. 2, where respective layers are sequentially stacked in order from a base substrate to a connecting electrode, and FIG. 3 is a schematic diagram illustrating a structure of layers of the thin film transistor taken along a line A-B in FIG. 2. Referring to FIGS. 2 to 3, the thin film transistor includes: a base substrate 01, and a drain 2, a source 3, an active layer 4 and a gate 5 which are arranged on the base substrate 01.

Specifically, referring to FIG. 3, the drain 2 and the source 3 are arranged in different layers, and any two of an orthographic projection of the drain 2 on the base substrate 1, an orthographic projection of the source 3 on the base substrate 1, and an orthographic projection of the active layer 4 on the base substrate 1 at least partially overlap each other. Since it adopts a structure where the drain 2, the source 3 and the active layer 4 are vertically arranged, that is, the drain 2, the source 3 and the active layer 4 are arranged in different layers and overlap each other in the vertical direction (the third direction Z perpendicular to the base substrate 1), compared with the structure of the thin film transistor in FIGS. 1a and 1b in which the source and the drain are arranged in the same layer and at intervals, and are connected to the active layer, with the thin film transistor according to the present disclosure, an area occupied by the thin film transistor in a plane can be effectively reduced, therefore, more thin film transistors can be arranged in a unit area, and the requirements on pixels of the display panel with the ultra-high PPI can be met.

Further, with continued reference to FIGS. 2 to 3, in the thin film transistor according to the present disclosure, the gate 5, the drain 2, the source 3, and the active layer 4 are arranged in different layers, respectively, and any two of an orthographic projection of the gate 5 on the base substrate 1, the orthographic projection of the drain 2 on the base substrate 1, the orthographic projection of the source 3 on the base substrate 1, and the orthographic projection of the active layer 4 on the base substrate 1 at least partially overlap each other. That is, the gate 5 is arranged to overlap the drain 2, the source 3, and the active layer 4 in the vertical direction, so that an area occupied by the thin film transistor in a plane can be further reduced.

Specifically, with continued reference to FIGS. 2 to 3, in the thin film transistor according to the present disclosure, a buffer layer 001 is arranged on the base substrate 1, the drain 2 is arranged on a side of the buffer layer 001 away from the base substrate 1, a data line D1 is also arranged in a layer where the drain 2 is located, and the data line D1 is connected to the drain 2. The source 3 is arranged on a side of the drain 2 away from the base substrate 1, and an interlayer insulating layer 002 is arranged between the source 3 and the drain 2. The gate 5 is arranged on a side of the source 3 away from the base substrate 1, where the positions of the source 3 and the drain 2 may alternatively be exchanged. FIG. 3 illustrates an exemplary structure of layers, and does not limit the structure of layers of the thin film transistor.

In some embodiments, with continued reference to FIGS. 2 to 3, a first via via1 is formed penetrating through the source 3 and the interlayer insulating layer 002 of the thin film transistor, and the first via via1 is formed at a position where the drain 2 is located. In other words, an orthographic projection of the first via via1 on the base substrate 1 is located within the orthographic projection of the drain 2 on the base substrate 1, and an inner wall of the first via via1 defines a space for forming the active layer of a vertical channel structure. In the process of manufacturing the thin film transistor, referring to parts (b) to (d) of FIG. 4a, after the source 3 is formed, a first via via1 is formed at a position where the source 3 and the drain 2 overlap with each other, the first via via1 penetrates through the source 3 and the interlayer insulating layer 002, so that the source 3 has an opening at the position corresponding to the first via via1 (for example, a circular region of the first via via1 in part (c) of FIG. 4*a*), then, the active layer 4 is formed on a side of the source 3 away from the base substrate 1, and the active layer 4 forms a recessed part 42 in a region corresponding to the opening in the source 3 as the first via via1 sinks, and forms a planar part 41 in a region corresponding to the source 3 where no opening is formed. Specifically, the active layer 4 includes the planar part 41 and the recessed part 42 connected to the planar part 41. The planar part 41 is arranged on a side of the source 3 away from the drain 2, and is connected to the source 3. The recessed part 42 is connected to a part of the planar part 42 at the position of the first via via1. Specifically, the planar part 41 is provided with an opening (i.e., at the position of the first via via 1) at the position of the first via via1, an upper edge of the recessed part 42 is fitted and connected to an edge of the opening, and the recessed part 42 is concave toward the drain 2 along the inner wall of the first via via1 and is connected to the drain 2. In other words, the recessed part 42 is conformal with the inner wall of the first via via1, and the bottom of the recessed part 42 is deposited on the upper surface of the drain 2, being in direct contact with and connected to the drain 2. By this arrangement, it is possible to form the active layer 4 having a vertical channel region (i.e., the recessed part 42), lay the active layer 4 in the vertical direction through the recessed part 42, therefore, the occupied area of the active layer 4 in a plane can be reduced, thereby the occupied area of the thin film transistor in a plane can be reduced.

In some embodiments, referring to FIG. 3, corresponding to the structure in which the active layer 4 has the recessed part 42, the gate 5 includes a main body part 51 and a protrusion part 52 connected to the main body part 51. The main body part 51 is arranged on a side of the planar part 41 of the active layer 4 away from the source 3, and the protrusion part 52 is arranged in a recessed accommodation space defined by the recessed part 42 of the active layer 4 and the main body part 51. That is, the protrusion part 52 is embedded in the recessed accommodation space of the recessed part 42 and is conformal with the recessed part 42, so that an inner wall of the recessed part 42 and an outer surface of the protrusion part 52 overlap in the vertical direction, an area where the active layer 4 and the gate 5 overlap is increased, that is, a length of a channel region is increased, which is beneficial to the stability of the threshold voltage Vth.

Figure 4B:
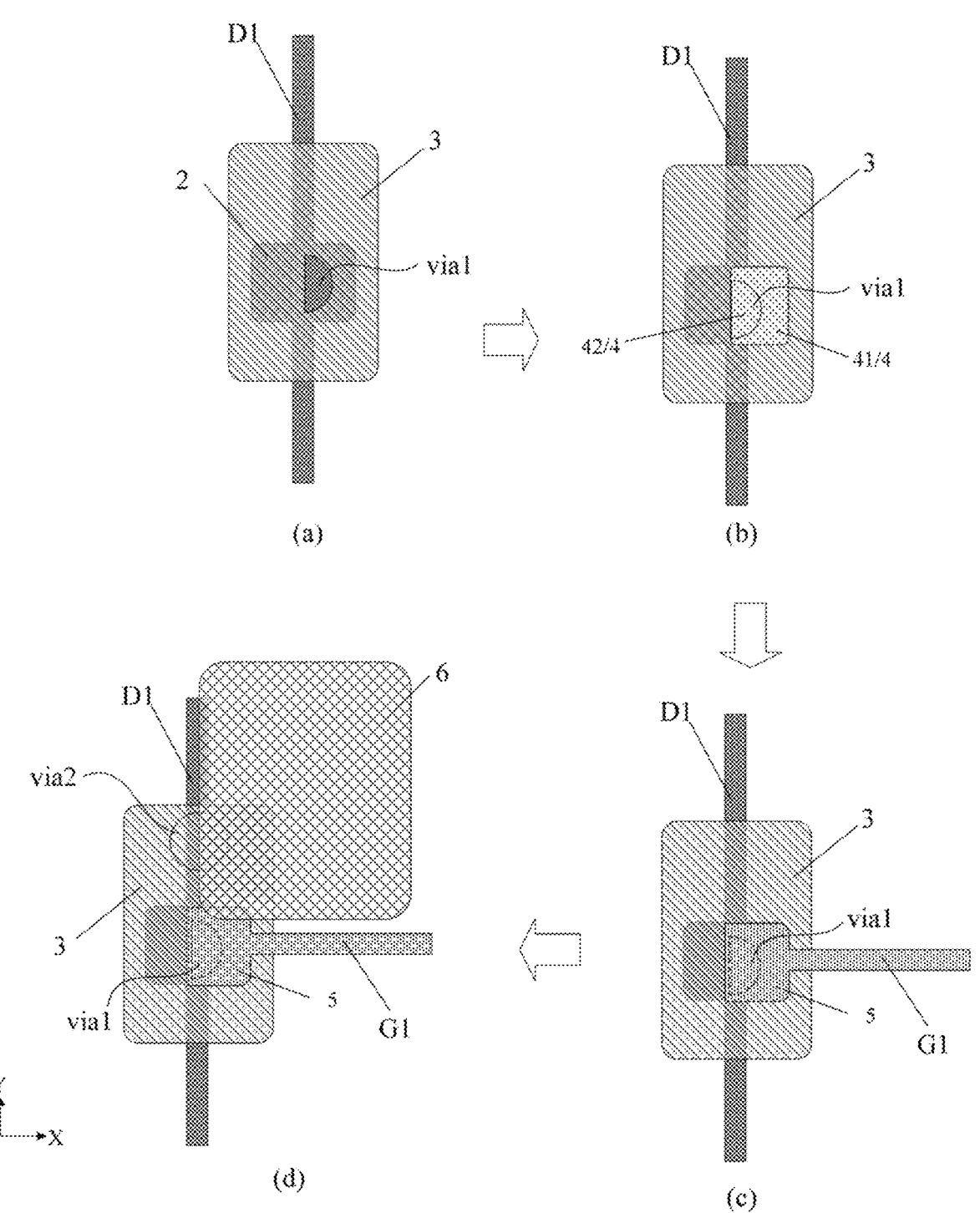
FIG. 4b is a schematic diagram of an exemplary structure of layers of a thin film transistor according to the present disclosure.

In some embodiments, the first via via1 may be of a non-full-via structure (or referred to as a non-circular-via structure), such as a half-via structure (or referred to as a semi-circular-via structure), a quarter-via structure (or referred to as a quarter-circular-via structure), etc., in which case the opening in the source 3 (e.g., the region shown by the semicircle in part (a) of FIG. 4*b*) may be half of an end aperture of the first via via1 away from the base substrate 1. In other words, an edge of the opening in the source 3 may be arranged not around an edge of the end aperture of the first via via1 away from the base substrate 1, and the source 3 may cover only a part of the end aperture of the first via via1 away from the base substrate 1. For example, referring to part (a) of FIG. 4*b*, the source 3 covers half of the end aperture of the first via via1 away from the base substrate 1, to form a half-hole structure. That is, an orthographic projection of the end aperture of the first via via1 away from the base substrate 1 on the base substrate 1 at least partially overlaps an orthographic projection of the opening of the source 3 on the base substrate 1. Correspondingly, in this case, the active layer 4 may also cover only a part of the first via via1. For example, referring to part (b) of FIG. 4*b*, the active layer 4 covers half of the end aperture of the first via via1 away from the base substrate 1, to form a half-via structure. Specifically, the recessed part of the active layer 4 may cover only a part of the inner wall of the first via via1, and the planar part may also cover only a part of the end aperture of the first via via1 away from the base substrate 1. In other words, the orthographic projection of the end aperture of the first via via1 away from the base substrate 1 on the base substrate 1 at least partially overlaps an orthographic projection of the active layer 4 on the base substrate 1. Similarly, in this case, the gate 5 may also cover only a part of the first via via1. For example, referring to part (c) of FIG. 4*b*, the active layer 5 covers half of the end aperture of the first via via1 away from the base substrate 1, to form a half-via structure. Specifically, the protrusion part of the active layer 5 may be embedded in only a part of the recessed accommodation space of the first via via1, and the main body part may also cover only a part of the end aperture of the first via via1 away from the base substrate 1. In other words, the orthographic projection of the end aperture of the first via via1 away from the base substrate 1 on the base substrate 1 at least partially overlaps an orthographic projection of the gate 5 on the base substrate 1.

In some embodiments, the orthographic projection of the gate 5 on the base substrate 1 covers the orthographic projection of the active layer 4 on the base substrate, to secure an area of the channel region of the active layer 4.

Accordingly, with continued reference to FIG. 3, the thin film transistor according to the present disclosure further includes a gate insulating layer 003, and the gate insulating layer 003 is arranged between the active layer 4 and the gate 5. In some embodiments, if the area of the source 3 is greater than that of the active layer 4, the gate insulating layer 003 is further arranged between the source 3 and the gate 5, covering the source 3. Specifically, the gate insulating layer 003 includes a first part arranged between the main part 51 of the gate 5 and the planar part 41 of the active layer 4, and a second part arranged between the protrusion part 52 of the gate 5 and the recessed part 42 of the active layer 4. That is, the first part is a planar layer arranged on the planar part 41, and the second part conforms to the inner wall of the recessed part 42 to form a recessed structure.

In some embodiments, with continued reference to FIG. 3, the first via via1 may be a cylindrical via, i.e., uniform in via diameter in the vertical direction. Alternatively, the first via via1 may be a conical via, i.e., in the direction from the source 3 to the drain 2, the via diameter of the inner wall of the first via via1 is smooth and gradually decreasing. In some embodiments, the end aperture of the first via via1 away from the base substrate 1 may be 2.7 μm. Since the recessed part 42 is formed in the first via via1, an orthographic projection of the bottom of the recessed part 42 connected to the drain 2 (i.e., the recessed bottom of the recessed part 42) on the base substrate 1 is located within an orthographic projection of the end aperture of the first via via1 away from the base substrate 1 on the base substrate 1. That is, the first via via1 is formed linearly along the vertical direction.

In some embodiments, referring to FIGS. 2 to 3, an orthographic projection of the source 3 on the base substrate 1 covers orthographic projections of the drain 2 and the active layer 4 on the base substrate 1. That is, an area of the source 3 in a plane is the largest, so that it is convenient for forming the opening in the source 3 and connecting the source 3 to a pixel electrode later.

In some embodiments, with continued reference to FIGS. 2 to 3, the thin film transistor further includes a connecting electrode 6 and a first insulating layer 004. The first insulating layer 004 covers a side of the main body part 51 of the gate 5 away from the base substrate 1, and the connecting electrode 6 is arranged on a side of the first insulating layer 004 away from the gate 5. The thin film transistor is provided with a second via via2 penetrating through the gate insulating layer 003 and the first insulating layer 004, and the connecting electrode 6 is connected to the source 3 through the second via via2. In a liquid crystal display panel, the connecting electrode 6 is a pixel electrode. In an organic semiconductor light emitting display panel or a light emitting diode display panel, the connecting electrode 6 is a cathode or an anode of a light emitting device. The first insulating layer 004 may be a planarization layer.

In some embodiments, with continued reference to FIG. 3, the second via via2 may be a cylindrical via, i.e., uniform in via diameter in the vertical direction. Alternatively, the second via via2 may be a conical via, i.e., in the direction from the source 3 to the drain 2, the via diameter of the inner wall of the second via via2 is smooth and gradually decreasing. In some embodiments, the end aperture of the first via via1 away from the base substrate 1 may be 4 μm.

In some embodiments, an orthographic projection of the second via via2 on the base substrate 1 has no overlapping region with an orthographic projection of the gate 5 on the base substrate 1 and an orthographic projection of the drain 2 on the base substrate 1, so that a parasitic capacitance generated between a metal connecting part in the second via via2 and the gate 5 or the drain 2 is avoided.

Figure 5:
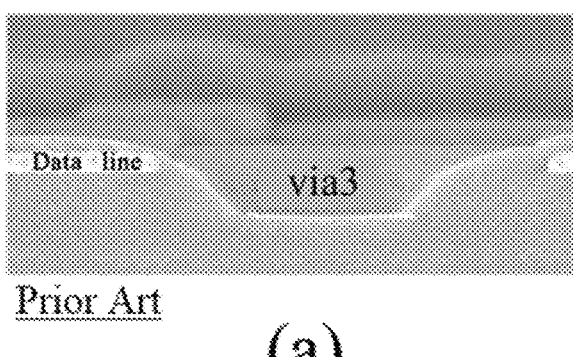
FIG. 5 illustrates microscope photographs of a structure of layers of a thin film transistor.
Figure 5:
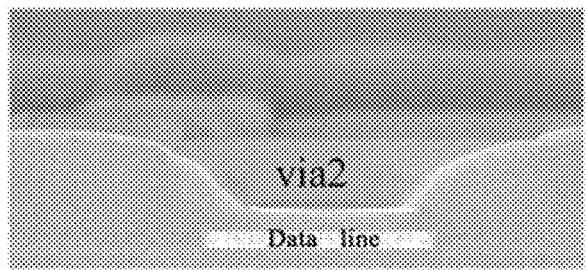

Referring to FIG. 5, part (a) of FIG. 5 illustrates a microscope photograph of a structure of layers at the third connecting via via3 connecting to the pixel electrode in the thin film transistor in the related art, and part (b) of FIG. 5 illustrates a microscope photograph of a structure of layers at the second via via2 in the thin film transistor according to the present disclosure. It can be seen from part (a) of FIG. 5 that a part of the insulating layer (e.g., the planarization layer 05 in FIG. 1b) at the inner wall of the third connecting via via3, which insulates the data lines on the left and right sides of the third connecting via via3, is almost etched away during forming the third connecting via via3, so that the data lines are prone to interfere with the metal connecting part in the third connecting via via3. Referring to part (b) of FIG. 5, in the present disclosure, since the data line (for example, the data line D1 in FIG. 3) is arranged below the second via via2 (and the first via via1), a thickness of the insulating layer above the data line is not affected as long as the via depth is controlled, regardless of the inclination of the via wall during forming the via. The control of the via depth is easier to achieve than the control of the inclination of the via wall, so that interference is not prone to occur.

Moreover, since the thin film transistor according to the present disclosure occupies a smaller area in a plane, compared with the thin film transistor in the related art, under the same requirements on PPI, the spacing between the thin film transistors of the present disclosure can be set greater, so that the spacing between the data lines D1 connected to the drains 2 of the adjacent thin film transistors can be greater, the spacing between the second vias via2 in the adjacent thin film transistors can be greater, and the spacing between the second via via2 in the thin film transistor and an adjacent data line D1 can also be greater, thereby an interference can be effectively prevented from occurring, and the performance of the thin film transistor can be prevented from being affected.

In some embodiments, the active layer 4 of the thin film transistor may be made of various materials. For example, the active layer 4 is a metal oxide active layer, an amorphous silicon active layer, or the like. The metal oxide is, for example, Indium Gallium Zinc Oxide (IGZO), Indium Tin Zinc Oxide (ITZO), Indium Zinc aluminum Oxide (IAZO), or the like. For convenience of description, the active layer 4 being the IGZO active layer is taken as an example for description in this specification, but the present disclosure is not limited thereto.

In a second aspect, the present disclosure further provides a display panel, which includes a plurality of the above thin film transistors. The thin film transistor may be used as a switching transistor, a driving transistor, a gate integrated circuit transistor, or the like. The display panel may be any product or component with a display function, such as a mobile phone, a tablet computer, a television, a monitor, a notebook computer, a digital photo frame, a navigator, or the like. Other essential components of the display panel are understood by one of ordinary skill in the art, and are not described herein nor should they be construed as limiting the present disclosure.

Figure 6:
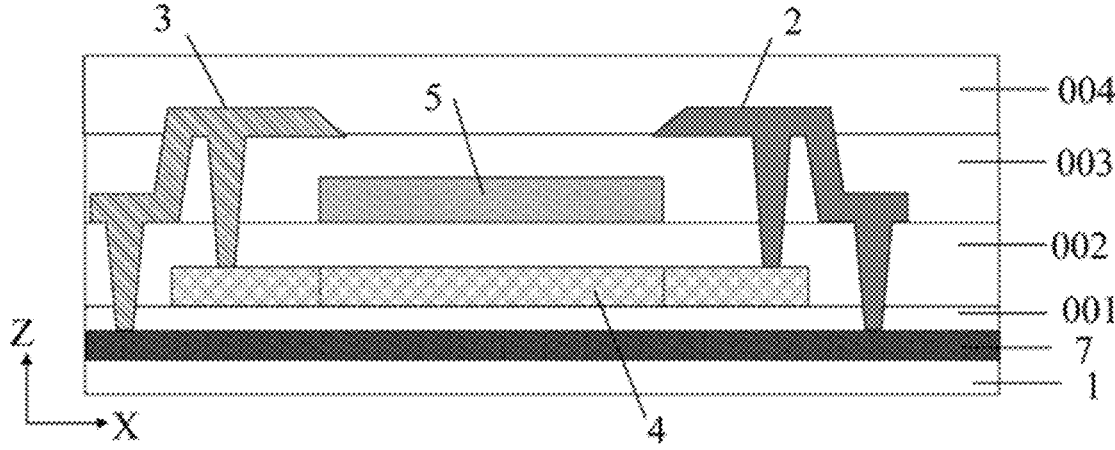
FIG. 6 is a schematic diagram illustrating a structure of layers of a thin film transistor in a peripheral region of a display panel according to the present disclosure.

In some embodiments, the display panel of the present disclosure includes a display region and a peripheral region arranged around the display region. A pixel driving circuit is arranged in the display region, and a Gate On Array (GOA) driving circuit is arranged in the peripheral region. Thin film transistors in the pixel driving circuit each may adopt the thin film transistor of the above vertical arrangement structure, and thin film transistors in the GOA driving circuit each may adopt the thin film transistor of the planar arrangement structure. FIG. 6 illustrates a structure of layers of a thin film transistor in the GOA region. For example, referring to FIG. 6, the thin film transistor includes a base substrate 1, a light shielding layer 7, a buffer layer 001, an active layer 4, an interlayer insulating layer 002, a gate 5, a gate insulating layer 003, a source 3 and a drain 2 in a same layer, and a first insulating layer 004, which are sequentially arranged on the base substrate 1. The source 3 is connected to the active layer 4 through a via penetrating through the gate insulating layer 003 and the interlayer insulating layer 002, and is connected to the light-shielding layer 7 through a via penetrating through the interlayer insulating layer 002 and the buffer layer 001.

Accordingly, the drain 2 is connected to the active layer 4 through a via penetrating through the gate insulator layer 003 and the interlayer insulating layer 002, and is connected to the light-shielding layer 7 through a via penetrating through the interlayer insulating layer 002 and the buffer layer 001.

In some embodiments, the active layer 4 of the thin film transistor in the GOA region may be made of various materials. For example, the active layer 4 of the thin film transistor in the GOA region is a metal oxide active layer or an amorphous active layer, where the metal oxide is, for example, IGZO, ITZO, IAZO, or the like. For convenience of description, the active layer 4 of the thin film transistor in the GOA region being an IGZO active layer is taken as an example for description, but the present disclosure is not limited thereto.

Figure 7:
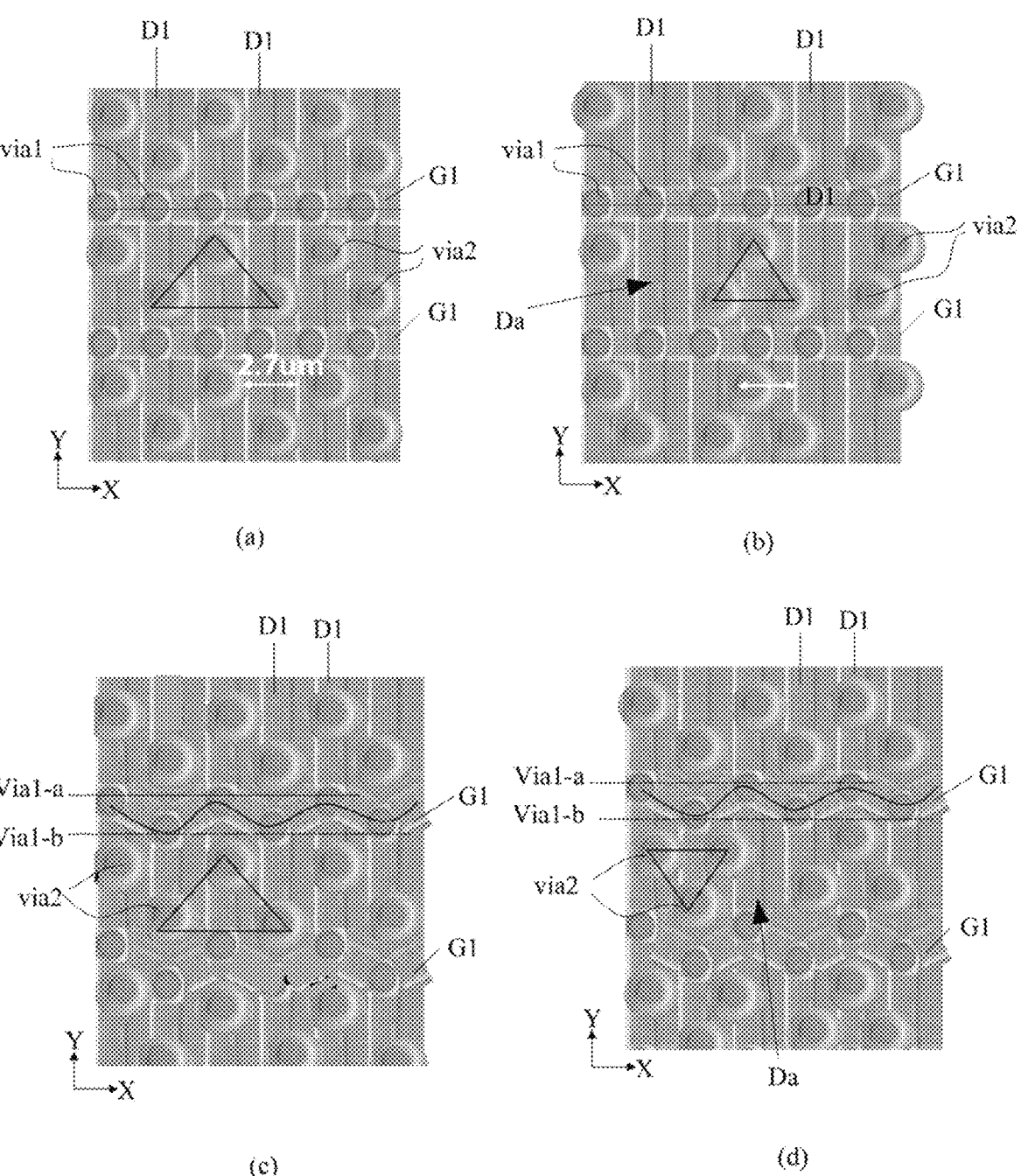
FIG. 7 illustrates microscope photographs of structures of a display panel in a plan view according to the present disclosure.

In some embodiments, referring to FIG. 7, FIG. 7 illustrates microscope photographs of four exemplary structures of a display panel in a plan view according to the present disclosure. The display panel according to the present disclosure further includes a plurality of gate lines G1 extending along a first direction X and arranged at intervals, and a plurality of data lines D1 extending along a second direction Y and arranged at intervals, where the first direction X intersects with the second direction Y. In this embodiment, it is taken as an example for description that the first direction X is a row direction, and the second direction Y is a column direction. A position where one gate line G1 overlaps one data line D1 is provided with one thin film transistor according to the present disclosure. That is, the thin film transistor is provided at an intersection between the gate line G1 and the data line D1. Specifically, a position where an orthographic projection of one gate line G1 on the base substrate 11 overlaps an orthographic projection of one data line D1 on the base substrate 1, at least partially overlaps an orthographic projection of one thin film transistor on the base substrate 1. It should be noted that the gate line G1 extends along the first direction X, and does not strictly extend in a straight line along the first direction X, as long as an overall trend of the gate line G1 is the first direction X. The gate line G1 may be in a shape of a straight line, a wave line, a zigzag line, an irregular line segment, or the like, which is not limited herein. Similarly, the data line D1 extends along the second direction Y, and does not strictly extend in a straight line along the second direction Y, as long as an overall trend of the data line D1 is the second direction Y. The data line D1 may be in a shape of a straight line, a wave line, a zigzag line, an irregular line segment, or the like, which is not limited herein.

Further, referring to FIGS. 2 to 3 and 7, a first via via1 penetrating through the source 3 and the interlayer insulating layer 002 is provided in the thin film transistor in the display panel, and a position, where the first via via1 is formed, is located at a position of the drain 2. In other words, an orthographic projection of the first via via1 on the base substrate 1 is located within an orthographic projection of the drain 2 on the base substrate 1. A position where an orthographic projection of one gate line G1 on the base substrate 1 overlaps an orthographic projection of one data line D1 on the base substrate 1 is referred to as an intersection, and an orthographic projection of the first via via1 in the thin film transistor arranged at the intersection on the base substrate 1 at least partially overlaps the intersection.

In some examples, referring to parts (a) and (b) of FIG. 7, the first vias via1 of a plurality of thin film transistors on the same gate line G1 are arranged side by side along the first direction X, in which case the gate line G1 may also be of a straight line and extend along the first direction X. In the first vias via1 of the plurality of thin film transistors on the same gate line G1, the spacing between any two adjacent first vias via1 is the same, and the manufacturing process of the first vias via1 with this arrangement is simple.

In some embodiments, referring to parts (c) and (d) of FIG. 7, the plurality of thin film transistors on the same gate line G1 are divided into a first row of thin film transistors and a second row of thin film transistors each arranged along the first direction X, and the first row of thin film transistors and the second row of thin film transistors are arranged at intervals along the second direction Y. In FIG. 7, each of the first vias via1 in the thin film transistors in the first row of thin film transistors is a via through which a dotted line Via1-a passes; and each of the first vias via1 in the thin film transistors in the second row of thin film transistors is a via through which a dotted line Via1-b passes. The first row of thin film transistors and the second row of thin film transistors are arranged at intervals along the second direction Y. A first via via1 of a thin film transistor belonging to the second row of thin film transistors is arranged between first vias via1 of any two adjacent thin film transistors belonging to the first row of thin film transistors. Similarly, a first via via1 of a thin film transistor belonging to the first row of thin film transistors is arranged between first vias via1 of any two adjacent thin film transistors belonging to the second row of thin film transistors. By arranging the first vias via1 in such a staggered manner, the spacing between the first vias via1 of two adjacent thin film transistors can be increased, thereby effectively avoiding interference between the vias and improving the stability of the thin film transistor.

In some embodiments, referring to FIGS. 2 to 3 and 7, the display panel includes a plurality of pixel structures, each pixel structure includes three sub-pixel structures of different colors, for example, three sub-pixel structures of colors of red, green, and blue, each sub-pixel structure includes a thin film transistor. Referring to FIGS. 2 to 3, the second via via2 penetrating through the gate insulating layer 003 and the first insulating layer 004 is provided in the thin film transistor, and the connecting electrode 6 is connected to the source 3 through the second via via 2. For three thin film transistors in a same pixel structure, an orthographic projection of the second via via2 in each thin film transistor on the base substrate 1 at least partially overlaps an orthographic projection of one corresponding data line D1 on the base substrate 1, and orthographic projections of the second vias via2 in different thin film transistors on the base substrate 1 at least partially overlaps orthographic projections of different data lines D1 on the base substrate 1, respectively. That is, three thin film transistors in the same pixel structure are arranged in three columns, respectively, and each column is provided with one thin film transistor.

In some embodiments, with reference to FIG. 7, for three thin film transistors in the same pixel structure, connection lines between any two of centers of the second vias via2 of the three thin film transistors are in a triangle, which may also be called a delta shape. It should be noted that the triangle herein is not a strict triangle, and may be an approximate triangle.

In some embodiments, for any two adjacent pixel structures in the plurality of pixel structures, the two adjacent pixel structures are referred to as a first pixel structure and a second pixel structure, respectively. Based on the above, for three thin film transistors in the same pixel structure, an orthographic projection of the second via via2 in each thin film transistor on the base substrate 1 at least partially overlaps an orthographic projection of one corresponding data line D1 on the base substrate 1, and orthographic projections of the second vias via2 in different thin film transistors on the base substrate 1 at least partially overlap orthographic projections of different data line D1 on the base substrate 1, respectively. That is, the three thin film transistors in the same pixel structure are arranged in three columns, respectively, and each column is provided with one thin film transistor. Referring to parts (a) and (c) of FIG. 7, among three data lines D1 corresponding to three thin film transistors in the first pixel structure and three data lines D1 corresponding to three thin film transistors in the second pixel structure, that is, among six data lines D1 in total, no other data line D1 exists between any two adjacent data lines D1, so that the sub-pixel structures can be compactly arranged, thereby facilitating the implementation of an ultra-high PPI display panel. Referring to parts (b) and (d) of FIG. 7, at least one data line D1 is arranged between the second via via2 in the thin film transistor of the first pixel structure closest to the second pixel structure and the second via via2 in the thin film transistor of the second pixel structure closest to the first pixel structure. That is, at least one data line D1, for example, the data line indicated by an arrow Da in parts (b) and (d) of FIG. 7, is left between the two pixel structures. In such a way, the spacing between the adjacent pixel structures is large enough to reduce the interference between the data lines D1.

In a third aspect, the present disclosure provides a method of manufacturing a thin film transistor, including: forming a base substrate 1, and sequentially forming a drain 2, a source 3 and an active layer 4 on the base substrate 1, where the drain 2 and the source 3 are arranged in different layers, and any two of an orthographic projection of the drain 2 on the base substrate 1, an orthographic projection of the source 3 on the base substrate 1 and an orthographic projection of the active layer 4 on the base substrate 1 at least partially overlap each other.

Specifically, referring to FIG. 3, based on the structure in which the thin film transistor includes a base substrate 1, and a buffer layer 001, a drain 2, an interlayer insulating layer 002, a source 3, an active layer 4, a gate insulating layer 003, a gate 5, a first insulating layer 004, and a connecting electrode 6, which are sequentially arranged on the base substrate 1, the manufacturing method according to the present disclosure may include a plurality of embodiments, which are exemplified below.

A First Embodiment

Figure 8:
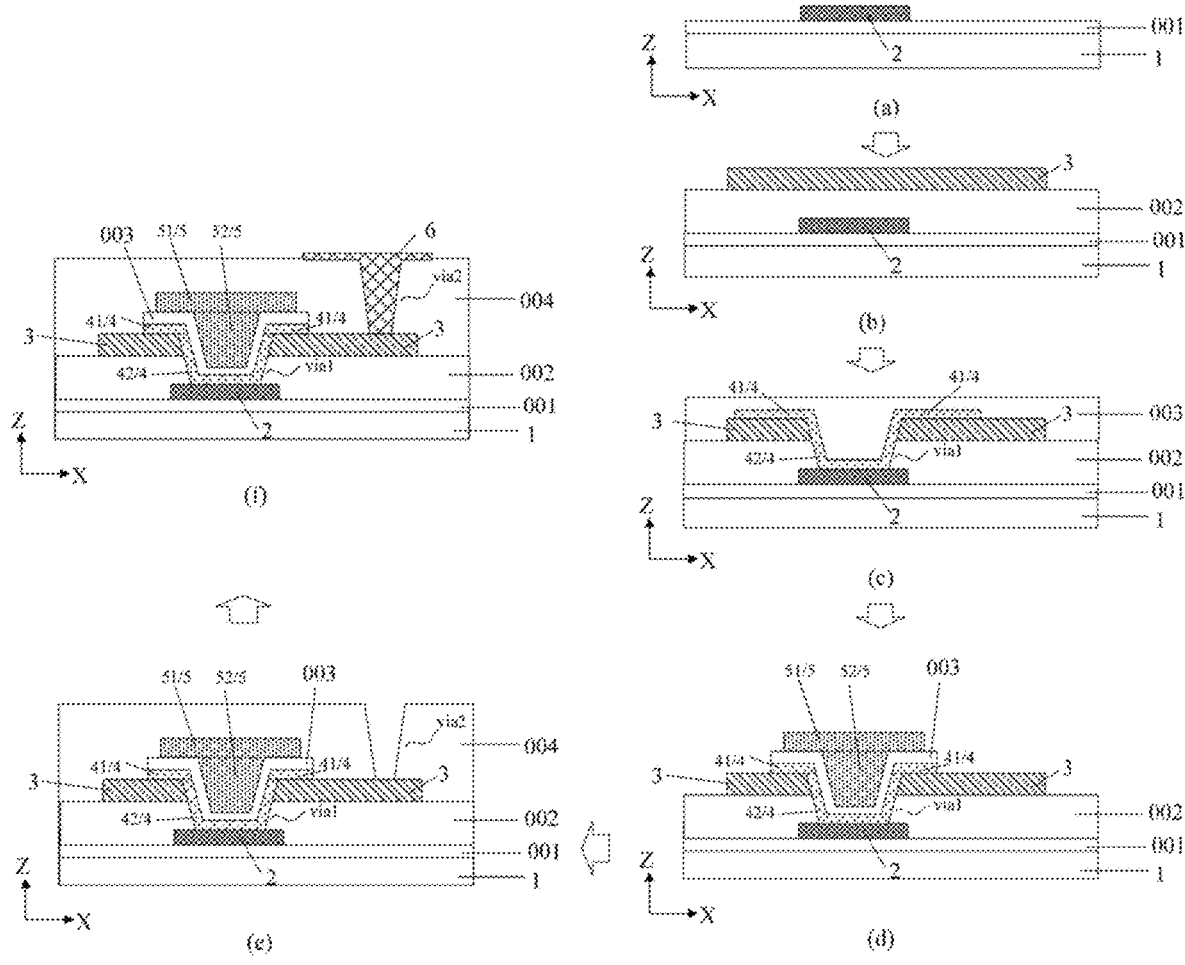
FIG. 8 is a first flowchart illustrating a method of manufacturing a thin film transistor according to the present disclosure.

Referring to FIG. 8, this embodiment adopts a manufacturing method of etching away a part of the gate insulating layer 003, and in this embodiment, the active layer 4 and the gate insulating layer 003 are etched in a same step. The method includes the following steps S1 to S7.

S1, cleaning the base substrate 1, forming the buffer layer 001 on the base substrate 1, depositing a metal on the buffer layer 001 to form a first metal layer, and patterning the first metal layer to form a pattern of the drain 2 and the data line (not shown in FIG. 8), as shown in part (a) of FIG. 8.

S2, depositing silicon oxide with a thickness of about in a range of 1000 to 10000 angstroms on a side of the drain 2 away from the base substrate 1, through Chemical Vapor Deposition (CVD) or Atomic Layer Deposition (ALD), to form the interlayer insulating layer 002.

S3, depositing a metal on a side of the interlayer insulating layer 002 away from the base substrate 1, to form a second metal layer, and patterning the second metal layer to form a pattern of the source 3, as shown in part (b) of FIG. 8.

S4, performing a via forming process to form the first via via1 penetrating through the source 3 and the interlayer insulating layer 002, depositing a metal oxide semiconductor layer on the first via via1, and depositing silicon oxide on a side of the metal oxide semiconductor layer away from the base substrate 1, to form the gate insulating layer 003, as shown in part (c) of FIG. 8.

When the first via via1 is formed during the via forming process, a via may be formed in the source 3 first, and then a via may be formed in the interlayer insulating layer 002. The metal oxide semiconductor is, for example, IGZO, ITZO, IAZO, or the like, and a thickness of the metal oxide semiconductor layer is about in a range of 200 to 3000 angstroms.

S5, performing an etching process on the metal oxide semiconductor layer and the gate insulating layer 003 together, to form patterns of the active layer 04 and the gate insulating layer; then, depositing a metal on a side of the gate insulating layer 003 away from the base substrate 1, to form a gate metal layer, and patterning the gate metal layer to form a pattern of the gate 5, as shown in part (d) of FIG. 8.

S6, depositing silicon oxide with a thickness of about in a range of 1000 to 10000 angstroms on a side of the gate 4 away from the base substrate 1, through CVD or ALD, to form a first insulating layer 004; performing a via forming process on the first insulating layer 004, to form the second via via2 penetrating through the first insulating layer 004, as shown in part (e) of FIG. 8.

S7, depositing a conductive layer (for example, indium tin oxide) with a thickness of about in a range of 40 nm to 1350 nm on a side of the first insulating layer 004 away from the base substrate 1, through a sputtering process, and forming the connecting electrode 6 through a patterning process, as shown in part (f) of FIG. 8.

It should be noted that patterning the first metal layer to form the drain 2 and the data line in step S1 and forming the first via via1 through the via forming process in S4 are performed in one same step, and the patterning process is completed at one time using a halftone mask.

It should be noted that, the patterning process in the above steps may be performed using a hard mask, so that an upper surface of the layer is smooth, and a roughness of the layer is reduced.

In some embodiments, the gate insulating layer 003 may be etched in the same step as the gate 4, so that the steps S4 to S6 are as follows.

S4, performing a via forming process to form a first via via1 penetrating through the source 3 and the interlayer insulating layer 002, depositing a metal oxide semiconductor layer on the first via via1, and forming the active layer 4 through a patterning process.

S5, depositing silicon oxide on a side of the active layer 4 away from the base substrate 1 to form a gate insulating layer 003, depositing a metal on a side of the gate insulating layer 003 away from the base substrate 1 to form a gate metal layer, and etching the gate insulating layer 003 and the gate metal layer together to form a pattern of the gate insulating layer and a pattern of the gate 5.

S6, depositing silicon oxide with a thickness of about in a range of 1000 to 10000 angstroms on a side of the gate 4 away from the base substrate 1, through CVD or ALD, to form the first insulating layer 004; and performing a via forming process on the first insulating layer 004, to form the second via via2 penetrating through the first insulating layer 004.

In this embodiment, the sequence of the patterning processes in the above steps may be changed willfully, and is not limited herein.

A Second Embodiment

Figure 9:
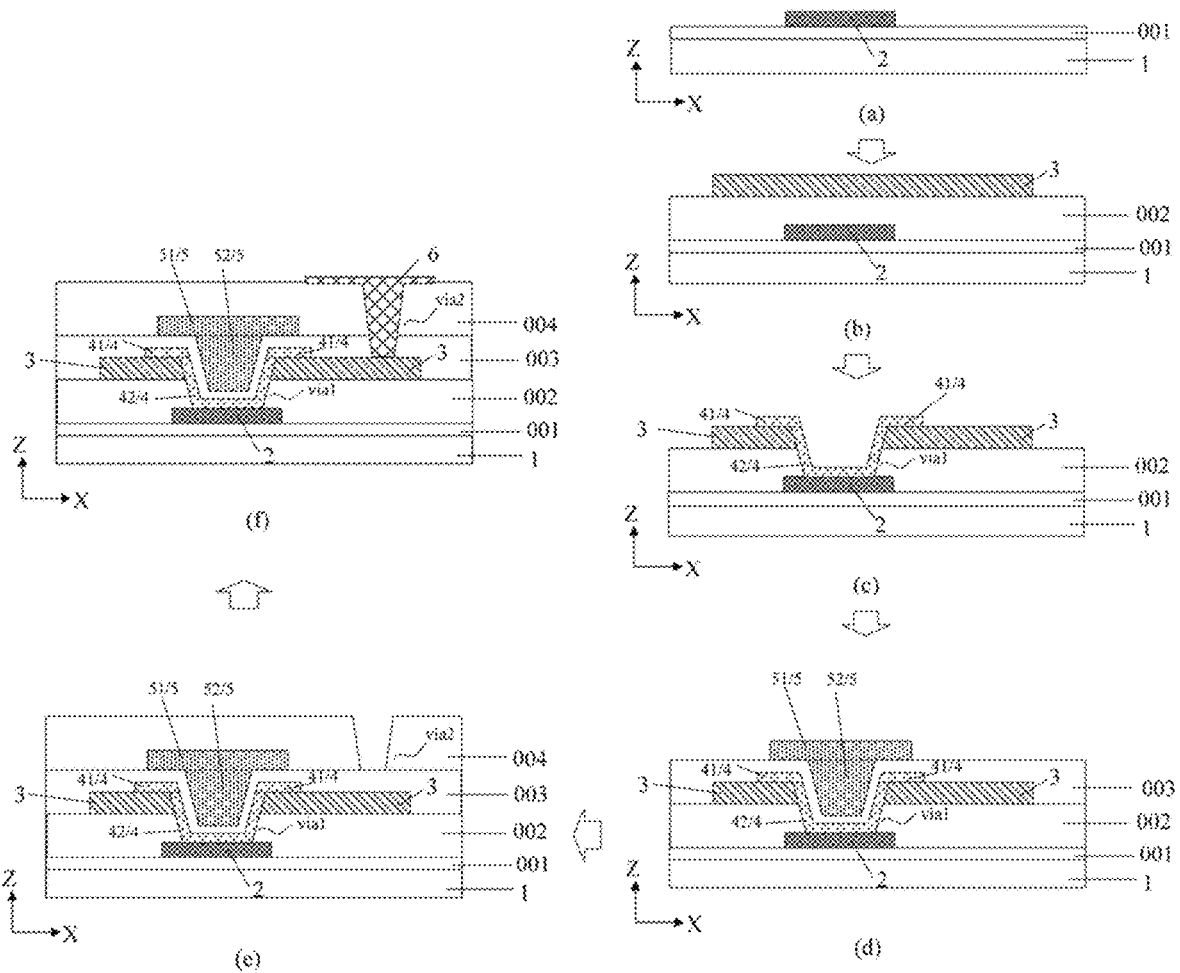
FIG. 9 is a second flowchart illustrating a method of manufacturing a thin film transistor according to the present disclosure.

Referring to FIG. 9, the present embodiment adopts a manufacturing method of remaining the gate insulating layer 003 without being etched, and the method includes the following steps S1 to S7.

S1, cleaning the base substrate 1, forming the buffer layer 001 on the base substrate 1, depositing a metal on the buffer layer 001 to form a first metal layer, and patterning the first metal layer to form a pattern of the drain 2 and the data line (not shown in FIG. 9), as shown in part (a) of FIG. 9.

S2, depositing silicon oxide with a thickness of about in a range of 1000 to 10000 angstroms on a side of the drain 2 away from the base substrate 1, through CVD or ALD, to form the interlayer insulating layer 002.

S3, depositing a metal on a side of the interlayer insulating layer 002 away from the base substrate 1, to form a second metal layer, and patterning the second metal layer to form a pattern of the source 3, as shown in part (b) of FIG. 9.

S4, performing a via forming process to form a first via via1 penetrating through the source 3 and the interlayer insulating layer 002, depositing a metal oxide semiconductor layer on the first via via1, and patterning the metal oxide semiconductor layer to form the active layer 4; and forming the gate insulating layer 003 through depositing silicon oxide on a side of the metal oxide semiconductor layer away from the base substrate 1, as shown in part (c) of FIG. 9.

When the first via via1 is formed during the via forming process, a via may be formed in the source 3 first, and then, a via may be formed in the interlayer insulating layer 002. The metal oxide semiconductor is, for example, IGZO, ITZO, IAZO, or the like. A thickness of the metal oxide semiconductor layer is about in a range of 200 to 3000 angstroms.

S5, depositing a metal on a side of the gate insulating layer 003 away from the base substrate 1 to form a gate metal layer, and patterning the gate metal layer to form a pattern of the gate 5, as shown in part (d) of FIG. 9.

S6, depositing silicon oxide with a thickness of about in a range of 1000 to 10000 angstroms on a side of the gate 4 away from the base substrate 1, through CVD or ALD, to form the first insulating layer 004; and performing a via forming process on the first insulating layer 004 to form the second via via2 penetrating the first insulating layer 004, as shown in part (e) of FIG. 9.

S7, depositing a conductive layer (for example, indium tin oxide) with a thickness of about in a range of 40 nm to 1350 nm on a side of the first insulating layer 004 away from the base substrate 1 through a sputtering process, and forming the connecting electrode 6 through a patterning process, as shown in par (f) of FIG. 9.

It should be noted that patterning the first metal layer to form the drain 2 and the data line in S1 and forming the first via via1 through the via forming process in S4 are performed in one same step, and the patterning process is completed at one time using a halftone mask.

It should be noted that, the patterning process in the above steps may be performed using a hard mask, so that an upper surface of the layer is smooth, and a roughness of the layer is reduced.

In this embodiment, the sequence of the patterning processes in the above steps may be changed willfully, and is not limited herein.

It will be understood that the above embodiments are merely exemplary embodiments adopted to illustrate the principles of the present disclosure, and the present disclosure is not limited thereto. It will be apparent to one of ordinary skill in the art that various modifications and improvements can be made without departing from the spirit and essence of the present disclosure, and such modifications and improvements are also considered to be within the protection scope of the present disclosure.

What is claimed is:

1. A display panel, comprising a plurality of thin film transistors, each of which comprises a base substrate, and a drain, a source and an active layer on the base substrate,
  wherein the drain and the source are in different layers, respectively, and any two of an orthographic projection of the drain on the base substrate, an orthographic projection of the source on the base substrate and an orthographic projection of the active layer on the base substrate at least partially overlap each other, wherein the display panel further comprises a plurality of gate lines extending along a first direction and arranged at intervals, and a plurality of data lines extending along a second direction and arranged at intervals, wherein the first direction and the second direction intersect with each other; wherein, a position, where an orthographic projection of each of the plurality of gate lines on the base substrate and an orthographic projection of each of the plurality of data line on the base substrate overlap each other, at least partially overlaps an orthographic projection of a corresponding one of the plurality of thin film transistors on the base substrate, wherein the display panel comprises a plurality of pixel structures, each of the plurality of pixel structures comprises three sub-pixel structures of different colors, and each of the three sub-pixel structures comprises a corresponding one of the plurality of thin film transistors, wherein the thin film transistor further comprises a gate, a connecting electrode, an interlayer insulating layer and a first insulating layer, the first insulating layer is on a side of the gate away from the base substrate, the interlayer insulating layer is between the source and the drain, and the connecting electrode is on a side of the first insulating layer away from the gate; the thin film transistor is provided with a second via penetrating through the interlayer insulating layer and the first insulating layer, and the connecting electrode is connected to the source through the second via; and for the three thin film transistors in a same pixel structure, the orthographic projection of the second via in one of the three thin film transistors on the base substrate at least partially overlaps the orthographic projection of one corresponding data line on the base substrate, and the orthographic projections of the second vias of different thin film transistors on the base substrate at least partially overlap the orthographic projections of different data lines on the base substrate, respectively.

2. The display panel according to claim 1, wherein the gate, the drain, the source and the active layer are arranged in different layers, respectively; an orthographic projection of the gate on the base substrate at least partially overlaps any one of the orthographic projection of the drain on the base substrate, the orthographic projection of the source on the base substrate and the orthographic projection of the active layer on the base substrate;
  wherein the drain is on a side of the source close to the base substrate, and the gate is on a side of the source away from the base substrate;
  wherein the thin film transistor further comprises an interlayer insulating layer between the source and the drain,
  wherein the thin film transistor is provided with a first via penetrating through the source and the interlayer insulating layer, and an orthographic projection of the first via on the base substrate is within the orthographic projection of the drain on the base substrate;
  wherein the active layer comprises a planar part and a recessed part connected to the planar part; the planar part is on a side of the source away from the drain, and is connected to the source;
  the recessed part is connected to a part of the planar part at the first via, and the recessed part is concave towards the drain along an inner wall of the first via and is connected to the drain; and
  the position, where an orthographic projection of each of the plurality of gate lines on the base substrate and an orthographic projection of each of the plurality of data line on the base substrate overlap each other, is referred to as an intersection, and the orthographic projection of the first via in the thin film transistor at the intersection on the base substrate at least partially overlaps the intersection.

3. The display panel according to claim 2, wherein the first vias of the thin film transistors on a same gate line are arranged side by side in the first direction.

4. The display panel according to claim 2, wherein the thin film transistors on a same gate line are divided into a first row of thin film transistors arranged along the first direction and a second row of thin film transistors arranged along the first direction, and the first row of thin film transistors and the second row of thin film transistors are spaced apart from each other along the second direction; between any two adjacent thin film transistors belonging to the first row of thin film transistors, is arranged one thin film transistor belonging to the second row of thin film transistors.

5. The display panel according to claim 1, wherein for the three thin film transistors in the same pixel structure, connecting lines between every two of centers of the second vias in the three thin film transistors is in a triangle.

6. The display panel according to claim 1, wherein for any two adjacent pixel structures in the plurality of pixel structures, the two adjacent pixel structures are referred to as a first pixel structure and a second pixel structure, respectively, and at least one data line is between the second via in the thin film transistor of the first pixel structure closest to the second pixel structure and the second via in the thin film transistor of the second pixel structure closest to the first pixel structure.

7. The display panel according to claim 1, wherein the gate, the drain, the source and the active layer are arranged in different layers, respectively; an orthographic projection of the gate on the base substrate at least partially overlaps any one of the orthographic projection of the drain on the base substrate, the orthographic projection of the source on the base substrate and the orthographic projection of the active layer on the base substrate.

* * * * *